(12) United States Patent
Chivers

(10) Patent No.: US 7,556,206 B2
(45) Date of Patent: Jul. 7, 2009

(54) TEMPERATURE COMPENSATED CLOCK DELAY CLOSED LOOP CIRCUIT

(75) Inventor: Mark A. Chivers, Mckinney, TX (US)

(73) Assignee: L3 Communications Integrated Systems, L.P., Greenville, TX (US)

( * ) Notice: Subject to any disclaimer, the term of this patent is extended or adjusted under 35 U.S.C. 154(b) by 521 days.

(21) Appl. No.: 11/342,953

(22) Filed: Jan. 30, 2006

(65) Prior Publication Data

US 2007/0176008 A1    Aug. 2, 2007

(51) Int. Cl.
    *F23N 5/20*    (2006.01)
(52) U.S. Cl. .................. 236/46 R; 341/118; 713/322
(58) Field of Classification Search ............... 236/46 R; 341/118; 713/322
    See application file for complete search history.

(56) References Cited

U.S. PATENT DOCUMENTS

| | | | | |
|---|---|---|---|---|
| 4,445,083 A * | 4/1984 | DeFalco | ................ | 323/273 |
| 4,763,105 A * | 8/1988 | Jenq | ................ | 341/120 |
| 5,485,127 A * | 1/1996 | Bertoluzzi et al. | ................ | 331/69 |
| 5,488,369 A | 1/1996 | Miller | | |
| 5,490,059 A * | 2/1996 | Mahalingaiah et al. | ...... | 364/166 |
| 5,752,011 A * | 5/1998 | Thomas et al. | ................ | 713/501 |
| 6,204,784 B1 | 3/2001 | Hatfield | | |
| 6,249,154 B1 * | 6/2001 | Jouffre et al. | ................ | 327/91 |
| 6,266,306 B1 * | 7/2001 | Schell et al. | ................ | 369/44.34 |
| 6,630,872 B1 * | 10/2003 | Lanoue et al. | ................ | 331/176 |
| 2002/0039211 A1 * | 4/2002 | Shen et al. | ................ | 359/110 |
| 2002/0190764 A1 * | 12/2002 | Nichols | ................ | 327/156 |
| 2003/0076183 A1 * | 4/2003 | Tam et al. | ................ | 331/100 |
| 2003/0201838 A1 * | 10/2003 | Tam et al. | ................ | 331/74 |

* cited by examiner

*Primary Examiner*—Ljiljana (Lil) V Ciric
(74) *Attorney, Agent, or Firm*—Hovey Williams LLP

(57) ABSTRACT

Embodiments of the present invention provide a temperature compensating circuit. The circuit generally includes a clock element operable to provide an adjustable clock signal, a buffer element coupled with an analog-to-digital converter and operable to receive the adjustable clock signal, a temperature sensor operable to sense a temperature, and a logic element coupled with the clock element and the temperature sensor. The logic element is operable to acquire the temperature from the temperature sensor and adjust the clock signal based upon the acquired ambient temperature. Such a configuration compensates for temperature variations and reduces system complexity and required component space, thereby providing a compact and efficient design.

18 Claims, 2 Drawing Sheets

TEMPERATURE COMPENSATED CLOCK DELAY CLOSED LOOP CIRCUIT

BACKGROUND OF THE INVENTION

1. Field of the Invention

The present invention relates to temperature compensating circuits. More particularly, the invention relates to a temperature compensating circuit operable to provide a single clock domain for analog-to-digital converter outputs.

2. Description of the Related Art

Analog-to-digital converters (ADCs) are utilized in innumerable environments to convert analog signals to digital signals. Although ADCs are operable to rapidly convert analog signals to digital signals, the performance of ADCs, including calculation and throughput latency, is dependent upon temperature. For instance, as temperature increases or decreases, throughput latency increases and decreases, respectively, by a corresponding amount. Such variations in ADC performance often have a substantial and detrimental impact on system usage, particularly in high speed configurations.

Devices have been developed to attempt to compensate for variations in ADC performance caused by temperature changes. As shown in FIG. 1, these devices typically require the utilization of at least one first-in-first-out (FIFO) buffer for each ADC output and a plurality of independent clock domains. Specifically, a first clock domain is utilized for sampling by the ADCs, a second clock domain is utilized by the FIFO buffers, and a third clock domain is utilized by filters or other elements coupled with the FIFO buffers.

Unfortunately, utilization of a plurality of FIFO buffers and multiple clock domains requires additional component space, increases routing and design complexity, and increases heat generated by the system. Thus, systems are often unable to utilize FIFO buffers or other conventional methods and devices to compensate for ADC temperature variations.

SUMMARY OF THE INVENTION

The present invention solves the above-described problems and provides a distinct advance in the art of temperature compensating circuits. More particularly, the invention provides a temperature compensating circuit operable to provide a single clock domain for analog-to-digital converter outputs. Such a configuration reduces system complexity and required component space, thereby providing a compact and efficient design.

One embodiment of the present invention provides a temperature compensating circuit which generally includes a clock element operable to provide an adjustable clock signal, a buffer element coupled with an analog-to-digital converter and operable to receive the adjustable clock signal, a temperature sensor operable to sense a temperature, and a logic element coupled with the clock element and the temperature sensor. The logic element is operable to acquire the temperature from the temperature sensor and adjust the clock signal based upon the acquired temperature.

In another embodiment, the circuit includes a clock element operable to provide an adjustable clock signal, a plurality of buffer elements each coupled with one or more analog-to-digital converters and operable to receive the adjustable clock signal, a temperature sensor operable to sense a temperature, and a logic element coupled with the clock element and the temperature sensor. Each buffer element includes a setup time and a hold time and is operable to acquire data from one or more of the analog-to-digital converters according to the received clock signal. The logic element is operable to acquire the temperature from the temperature sensor and adjust the clock signal based upon the acquired temperature to correspond to the setup and hold times.

In another embodiment, the circuit includes a plurality of analog-to-digital converters each operable to sample a signal, a clock element operable to provide a sampling clock signal and an adjustable clock signal, a plurality of digital filter elements each coupled with one or more of the analog-to-digital converters and operable to receive the adjustable clock signal, a digital temperature sensor operable to sense a temperature, and a logic element coupled with the clock element and the temperature sensor. Each digital filter element includes a setup time and a hold time and is operable to acquire data from one or more of the analog-to-digital converters according to the received clock signal. The logic element is operable to acquire the temperature from the temperature sensor and, between data collection periods, adjust the clock signal based upon the acquired temperature to correspond to the setup and hold times.

Other aspects and advantages of the present invention will be apparent from the following detailed description of the preferred embodiments and the accompanying drawing figures.

BRIEF DESCRIPTION OF THE DRAWING FIGURES

A preferred embodiment of the present invention is described in detail below with reference to the attached drawing figures, wherein.

Figure 1:
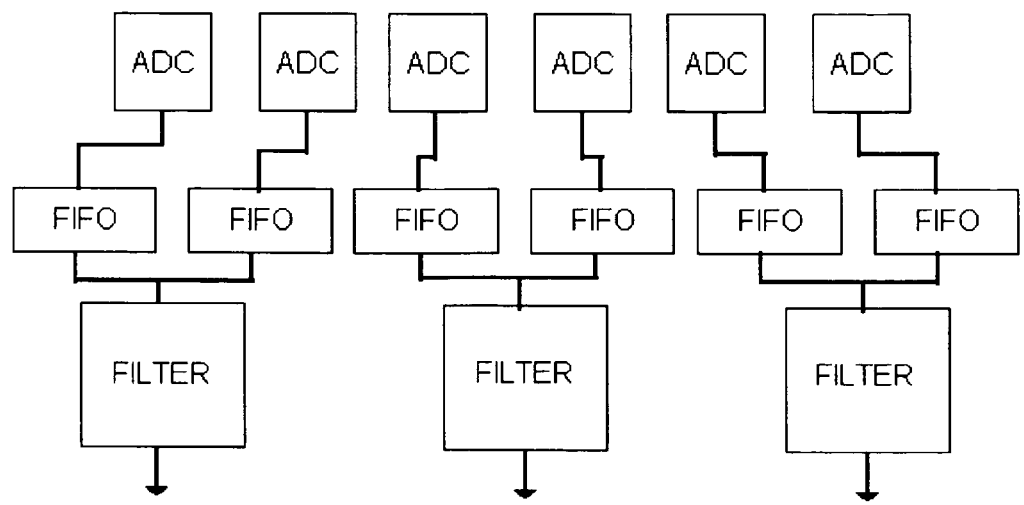
FIG. 1 is a block diagram of a prior art temperature compensating circuit.

The drawing figures do not limit the present invention to the specific embodiments disclosed and described herein. The drawings are not necessarily to scale, emphasis instead being placed upon clearly illustrating the principles of the invention.

DETAILED DESCRIPTION OF THE PREFERRED EMBODIMENTS

The following detailed description of the invention references the accompanying drawings that illustrate specific embodiments in which the invention can be practiced. The embodiments are intended to describe aspects of the invention in sufficient detail to enable those skilled in the art to practice the invention. Other embodiments can be utilized and changes can be made without departing from the scope of the present invention. The following detailed description is, therefore, not to be taken in a limiting sense. The scope of the present invention is defined only by the appended claims, along with the full scope of equivalents to which such claims are entitled.

Figure 2:
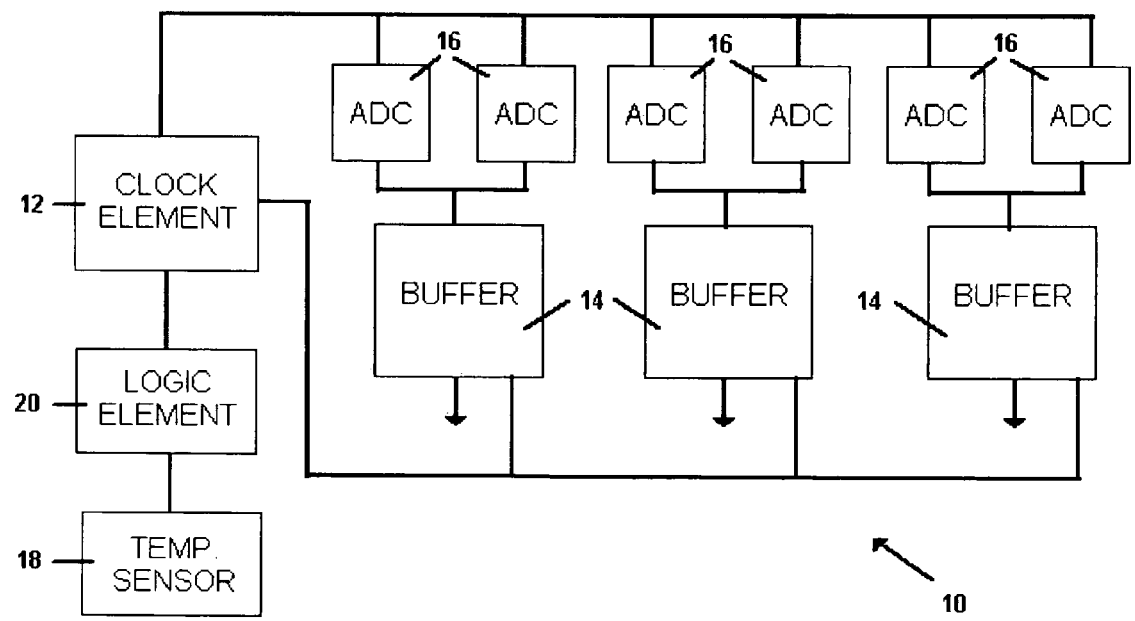
FIG. 2 is a block diagram of a temperature compensating circuit constructed in accordance with various preferred embodiments of the present invention.
Figure 3:
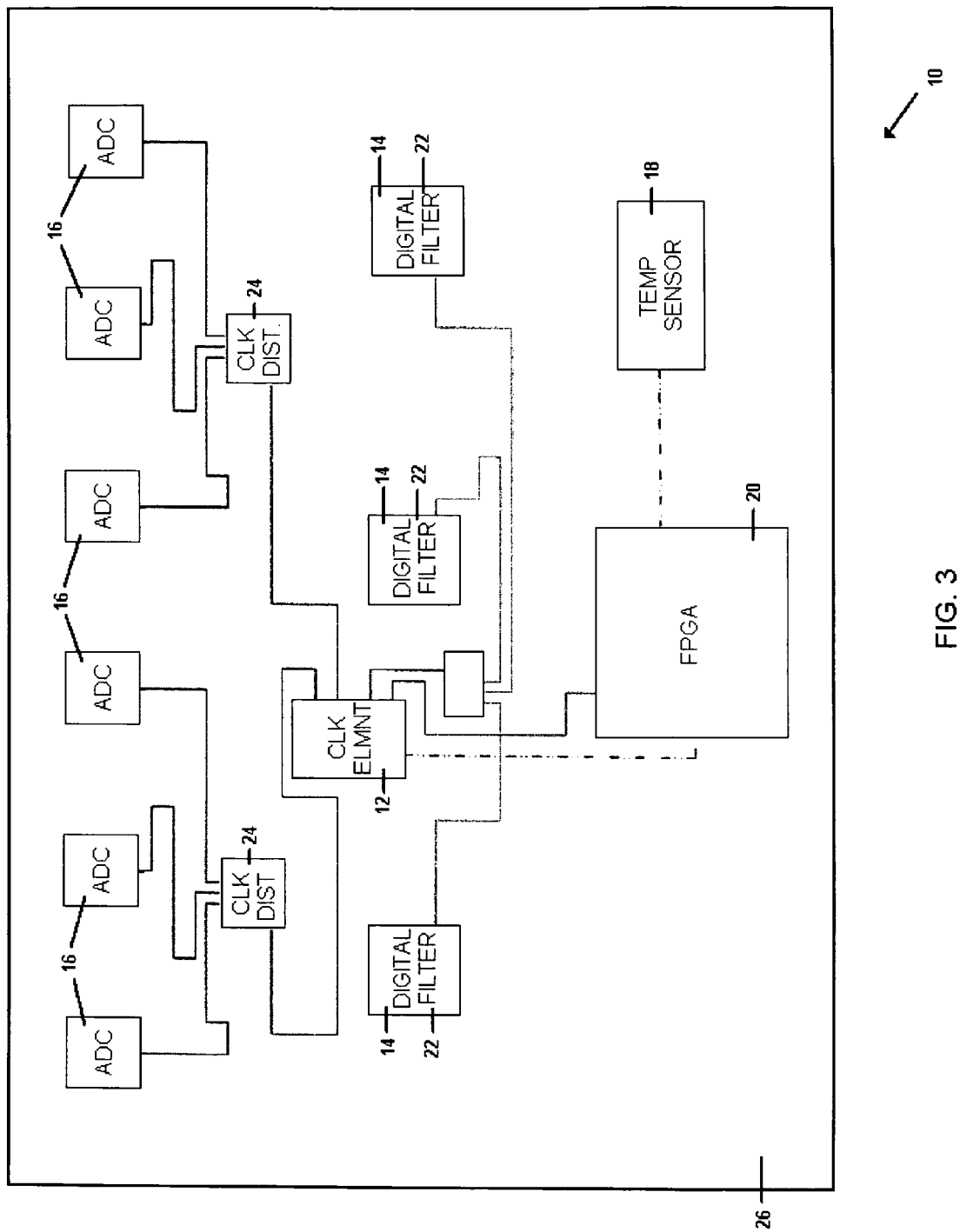
FIG. 3 is a block diagram illustrating some of the components of the circuit of FIG. 2 is more detail.

Referring to FIGS. 2-3, a temperature compensating circuit 10 is shown constructed in accordance with various preferred embodiments of the present invention. As is described in more detail below, the circuit 10 generally includes a clock element 12 operable to provide one or more clock signals, a buffer element 14 operable to be coupled with the clock element 12 and one or more analog-to-digital converters (ADCs) 16, a temperature sensor 18 operable to sense an ambient temperature, and a logic element 20 coupled with the clock element 12 and the temperature sensor 18 and operable to vary one or more of the provided clock signals based upon the determined ambient temperature.

The clock element 12 is operable to provide one or more clock signals for utilization by the circuit 10 or other components such as the ADCs 16. Preferably, the clock element 12 is operable to provide a sampling clock signal for use by the ADCs 16 and an adjustable clock signal for use by the buffer element 14.

The sampling clock signal enables the ADCs 16 to sample signals at a desired interval based on the rising edges, falling edges, or other characteristics of the sampling clock signal. The clock element 12 may generate the sampling clock signal in a substantially conventional manner, such as by utilizing oscillating or periodic circuits, elements, or devices.

The adjustable clock signal is operable to be adjusted to have varying frequencies, duty cycles, amplitudes, phases, combinations thereof, or any other signal characteristic. The adjustable clock signal may be generally similar to the sampling clock signal and generated in a substantially similar manner, with the exception being that the adjustable clock signal is not limited to a static configuration.

Preferably, the adjustable clock signal is operable to be adjusted in precise increments to accurately correct for temperature variations, as discussed below. For instance, the adjustable clock signal may be operable to be adjusted in increasing and decreasing increments of approximately 300 picoseconds. However, as should be appreciated by those skilled in the art, the adjustable clock signal may be adjusted in increments of any amount to conform to various system and operations requirements.

In various embodiments, the clock element 12 is operable to receive a control signal from the logic element 20. The control signal provides the clock element 12 with adjustment information, such as a correction amount, regarding the desired form of the adjustable clock signal. For example, the control signal may include information instructing the clock element 12 to increase or decrease the period of the adjustable clock signal by a provided or predetermined amount, to generate the adjustable clock signal with a provided or predetermined period or frequency, etc., as is discussed in more detail below.

Preferably, the clock element 12 comprises a clock distribution integrated circuit having an on-chip phase locked loop (PLL). For instance, in various embodiments the clock element 12 comprises an AD9510 clock distribution IC, distributed by ANALOG DEVICES, INC. of Norwood, Mass. In such embodiments, one or more low voltage differential signaling (LVDS) outputs with internal adjustable delays may be utilized to provide the adjustable clock signal.

Utilization of the AD9510 or similar clock distribution elements enables the circuit 10 to accurately and precisely provide the adjustable clock signal. However, the clock element 12 may comprise any device or combination of devices that are operable to provide an adjustable clock signal, including passive clock generating elements.

In various embodiments, the clock element 12 may be coupled with one or more clock distribution elements 24 to facilitate propagation of clock signals generated by the clock element 12. For instance, the clock element 12 may be coupled with a plurality of AD9512 clock distribution integrated circuits, distributed by ANALOG DEVICES, INC. of Norwood, Mass., to ensure uniform clock signals throughout the circuit 10.

The buffer element 14 is coupled with the clock element 12 and one or more of the ADCs 16 to receive the adjustable clock signal from the clock element 12 and acquire data from the ADCs 16 according to the received clock signal. For example, on each rising edge of the adjustable clock signal the buffer element 14 may be operable to latch or otherwise acquire data from one or more of the ADCs 16. Thus, the buffer element 14 may any device or combination of devices operable to synchronously acquire data, including registers, buffers, flip-flops, passive and active components, synchronous memory elements, combinations thereof, etc.

The buffer element 14 includes a setup time and a hold time. As is known in the art, the setup time corresponds to the time that an applied input must be valid before it is sampled while the hold time corresponds to the time that the applied input must be validly maintained after sampling. As also should be appreciated by those skilled in the art, the particular setup and hold times of the buffer element 14 will be dependent on the particular components utilized to implement the buffer element 14, such that the setup and hold times are not necessarily the same for all buffer elements in all embodiments.

Due to speed and performance requirements, in various embodiments the buffer element 14 preferably comprises a digital filter element 22 operable to provide functionality in addition to buffering. For instance, the buffer element 14 may comprise a GC5016 wideband quad digital down-converter/up-converter distributed by TEXAS INSTRUMENTS, INC. of Dallas, Tex. Utilization of the digital filter element 22 enables additional processing of acquired data without requiring additional components, such that the digital filter element 22 may both synchronously acquire data according to the adjustable clock signal and filter, convert, or otherwise modify the acquired data for use by other system components.

The buffer element 14 may also be operable to acquire data from more than one ADC output, such that a single buffer element, such as the GC5016 converter discussed above, may synchronously acquire data from two or more sources according to the received adjustable clock signal. As discussed below in more detail, various embodiments of the present invention may be coupled with or include a plurality of ADCs, such that utilization of a buffer element operable to acquire data from more than one ADC output reduces the number of required components and associated component space.

Further, in various embodiments the present invention may include a plurality of buffer elements 14 for coupling with one or more ADCs. Utilization of the plurality of buffer elements 14 enables the present invention to provide a single clock domain for a plurality of ADC outputs and function in environments where more than one ADC or ADC output must be utilized. For instance, as shown in FIG. 2, three buffer elements 14 are coupled with six ADCs 16 to synchronously acquire data according to the adjustable clock signal provided by the clock element 12.

The ADCs 16 are operable to convert analog signals to digital signals in a substantially conventional manner. As discussed above, the clock element 12 and the buffer element 14 are each operable to couple with the ADCs 16. Preferably, the ADCs 16 are operable to synchronously acquire analog signals and convert the analog signals to digital signals utilizing the sampling clock signal provided by the clock element 12. However, the ADCs 16 may be asynchronous or utilize other clock signals provided by other system components.

Further, each ADC 16 may include one or more outputs each providing a converted analog signal and/or a portion of a converted analog signal, such that the ADCs 16 utilized by the present invention are not limited to providing a single output. For example, the six ADCs 16 illustrated in FIG. 2 may correspond to a single ADC unit operable to provide six ADC outputs, etc.

In various embodiments, the ADCs 16 need not be integral or otherwise included within the circuit 10, as the circuit 10, and specifically the clock element 12 and the buffer element 14, are operable to couple with the ADCs 16. Thus, the circuit 10 may be utilized with any ADCs or combination of ADCs, and is not limited to any particular ADC configuration.

The temperature sensor 18 is operable to sense an ambient temperature of the circuit 10. The temperature sensor 18 may comprise any device or combination of devices operable to determine, detect, or otherwise sense ambient temperatures. Preferably, the temperature sensor 18 comprises a digital temperature sensor. Utilization of a digital temperature sensor facilitates the determination of the ambient temperature by enabling the temperature sensor 18 to easily and quickly provide the determined temperature to other circuit 10 components, such as the logic element 20.

In various embodiments, the temperature sensor 18 comprises an AD7814 10-bit digital temperature sensor distributed by ANALOG DEVICES, INC. of Norwood, Mass. Utilization of the digital temperature sensor, such as the AD7814, enables the circuit 10 to accurately determine temperatures across wide temperature ranges, including the U.S. military temperature specification, and rapidly provide determined temperatures to the logic element 20 in a readily usable format.

The temperature sensor 18 may also provide a change in ambient temperature in addition to or in place of the ambient temperature. For instance, the temperature sensor 18 may determine a change in temperature by comparing an acquired ambient temperature with a previously acquired temperature stored in a memory, by measuring or sensing a change in temperature instead of the ambient temperature, etc.

The logic element 20 is coupled with the clock element 12 and the temperature sensor 18 and is operable to acquire the ambient temperature from the temperature sensor 18 and adjust the adjustable clock signal accordingly. Preferably, the logic element 20 acquires the ambient temperature from the temperature sensor 18, determines the amount by which to correct the adjustable clock signal, and then provides the control signal to the clock element 12.

Thus, the logic element 20 may comprise any device or combination of devices operable to determine the amount by which to correct the adjustable clock signal, and provide the corresponding control signal. In various embodiments, the logic element 20 comprises a state machine operable to repeatedly acquire the ambient temperature, determine a correction amount, and provide the control signal to the clock element 12. As a result, the logic element 20 may comprise various elements, including microcontrollers, microprocessors, discrete logic elements such as NAND gates, memories, programmable logic devices (PLDs), active and passive semiconductor components, combinations thereof, etc.

Preferably, the logic element 20 comprises a PLD, such as a field programmable gate array (FPGA). Utilization of a PLD enables the circuit 10 to be easily configured to perform the functions described herein and additionally enables the logic element 20 to be initialized, reprogrammed, reconfigured, or otherwise dynamically modified to conform to changing circuit 10 and system usage.

The logic element 20 is preferably operable to adjust the adjustable clock signal, by determining the correction amount and providing the related control signal, to correspond to the setup and hold times of the buffer elements 14. Specifically, it is generally desirable to provide the adjustable clock signal such that the buffer element 14 accurately acquires data in a manner that satisfies the setup and hold times while still providing efficient performance.

For example, if the clock element 12 provides an adjustable clock signal that satisfies the sum of the setup and hold times for the buffer element 14 at a first temperature, and the temperature sensor 18 indicates that the first temperature is now a second temperature, the logic element 20 is operable to determine the correction amount based upon the second temperature and the setup and hold times to ensure that the adjustable clock signal is adjusted in a manner that continues to satisfy the sum of the setup and hold times for the buffer element 14, thereby compensating for temperature induced ADC performance variations while maintaining system and circuit 10 performance.

The logic element 20 may determine the correction amount and any associated information by utilizing various methods and devices. For instance, the logic element 20 may include a memory, such as a look-up table or other database of values, that associates temperatures with desired adjustable clock signal characteristics, such as a desired clock frequency. In such embodiments, the logic element 20 may receive the temperature from the temperature sensor 18, determine the desired correction amount through calculation or by utilizing the memory, and provide the control signal to the clock element 12 corresponding to the desired correction amount.

The logic element 20 may also determine the correction amount based upon a change in temperature. For instance, the logic element 20 may acquire a change in temperature from the temperature sensor 18 and/or determine a change in temperature by storing previously acquired temperatures in memory and comparing current temperatures to the previously acquired temperatures. Upon determining a change in temperature, the logic element 20 may calculate, retrieve from memory, or otherwise determine a desired correction amount to provide to the clock element 12.

As should be appreciated, the correction amount determined by the logic element 20 may correspond to a desired change in the adjustable clock signal, such as an increase or decrease in frequency, phase, duty cycle, amplitude, etc, and/or the correction amount may correspond only to the adjustable clock signal, such as by indicating the desired frequency, phase, duty cycle, amplitude, etc, of the adjustable clock signal. Thus, the logic element 20 may determine the correction amount to correspond to an incremental change and/or the logic element 20 may determine the correction amount to correspond to desired adjustable clock signal.

The logic element 20 provides the control signal to the clock element 12 to instruct the clock element 12 to adjust the adjustable clock signal according to the determined correction amount. For instance, the control signal may include information, such as a plurality of bits, corresponding to the correction amount and operable to be received and utilized by the clock element 12 to generate or otherwise provide the appropriate adjustable clock signal.

In various embodiments where the logic element 20 includes a PLD, the logic element 20 may be dynamically configured to determine the appropriate correction amount. For instance, in complex systems having many ADCs and other components, it may be impossible to accurately predict or otherwise predetermine appropriate correction amounts for each system. Utilization of a PLD, such as a FPGA, enables the logic element 20 to be dynamically configured by the circuit 10, other system components, or users, to empirically and dynamically determine appropriate correction amounts based upon temperature.

Further, in various embodiments the logic element 20 and the clock element 12 may be integral, such as where the logic element 20 and clock element 12 are included within the same die package, integrated circuit, housing, etc. For instance, the logic element 20 may comprise a FPGA, or other integrated circuit, having an integral and adjustable clock operable to perform the functions of the clock element 12 discussed above. Thus, the logic element 20 and the clock element 12 are not necessarily discrete components.

The logic element 20 preferably adjusts the adjustable clock signal only between data collection periods to prevent data corruption. "Data collection periods", as utilized herein, refers to the periods at which the ADCs 16 sample or otherwise acquire data. Thus, by adjusting the adjustable clock signal only between data collection periods, the logic element 20 prevents corruption of data resulting from missed or duplicate sampled signals. The logic element 20 may determine the data collections periods, and when to adjust the adjustable clock signal, through coupling with the clock element 12 to acquire the rate or period of the sampling clock signal. Alternatively, the logic element 20 may be statically or dynamically configured with the data collection period.

Due to the compact functionality provided by the circuit 10, the various circuit elements, such as the clock element 12, the ADCs 16, the temperature sensor 18, the logic element 20, etc, may be each mounted on a common circuit board 26. Utilization of the common circuit board 26 enables the circuit 10 to be utilized in a wide variety of applications and systems without consuming excess component space. Further, the common circuit board 26 may include only the clock element 12, the temperature sensor 18, and the logic element 20, as the circuit 10 may be coupled with external ADCs. Additionally, the utilization of the adjustable clock signal reduces routing and system complexity due to the elimination of FIFO buffers and multiple clock domains, thereby further reducing the size, power consumption, and heat generated by the circuit 10.

In use, the circuit 10 may be initially configured by a user by programming the logic element 20 to provide an initial adjustable clock signal. The user or system may provide appropriate correction amounts or data from which to determine correction amounts. However, various test sampling may be performed to determine appropriate correction amounts based on temperature, and the determined appropriate correction amounts may be stored or otherwise retained by the logic element 20.

After initialization, the ADCs 16 may be utilized in a generally conventional manner to sample and convert data according to the sampling clock signal provided by the clock element 12. During operation of the circuit 10, the temperature sensor 18 repeatedly acquires the ambient temperature and the logic element 20 repeatedly determines the appropriate correction value and provides the control signal to the clock element 12. Utilizing the provided control signals, the clock element 12 adjusts or otherwise generates an appropriate clock signal for use by the buffer element 14. Should system configuration or environmental conditions change, the logic element 20 may be reprogrammed or otherwise reconfigured to continue to accurately adjust the adjustable clock signal.

Although the invention has been described with reference to the preferred embodiment illustrated in the attached drawing figures, it is noted that equivalents may be employed and substitutions made herein without departing from the scope of the invention as recited in the claims.

Having thus described the preferred embodiment of the invention, what is claimed as new and desired to be protected by Letters Patent includes the following:

1. A temperature compensating circuit comprising:
   a clock element operable to provide an adjustable clock signal;
   an analog-to-digital converter operable to sample an input signal at a data rate determined by the clock element;
   a buffer element operable to couple with the clock element and the analog-to-digital converter, receive the adjustable clock signal, and acquire data from the analog-to-digital converter according to the received clock signal;
   a digital filter element coupled with the buffer element and operable to modify the data acquired by the buffer element;
   a temperature sensor operable to sense an ambient temperature; and
   a logic element coupled with the clock element and the temperature sensor, the logic element operable to acquire the ambient temperature from the temperature sensor and adjust the clock signal based upon the acquired ambient temperature.

2. The circuit of claim 1, further including a plurality of buffer elements each operable to couple with the clock element and one or more analog-to-digital converters, receive the adjustable clock signal, and acquire data from the one or more analog-to-digital converters according to the received clock signal.

3. The circuit of claim 1, wherein to logic element includes a state machine.

4. The circuit of claim 1, wherein the logic element includes a programmable logic device.

5. The circuit of claim 1, wherein to buffer element includes a setup time and a hold time and to logic element is operable to adjust to clock signal based on to acquired ambient temperature to correspond to the setup and hold times.

6. A temperature compensating circuit comprising:
   a clock element operable to provide an adjustable clock signal;
   a plurality of analog-to-digital converters operable to sample a plurality of input signals at a data rate determined by the clock element;
   a plurality of buffer elements each having a setup time and a hold time and operable to couple with the clock element and one or more analog-to-digital converters, receive the adjustable clock signal, and acquire data from one or more of the analog-to-digital converters according to the received clock signal;
   a digital filter element coupled with the buffer element and operable to modify the data acquired by the buffer element;
   a temperature sensor operable to sense an ambient temperature; and
   a logic element coupled with the clock element and the temperature sensor, the logic element operable to acquire the ambient temperature from the temperature sensor and adjust the clock signal based upon the acquired ambient temperature to correspond to the setup and hold times.

7. The circuit of claim 6, wherein the logic element includes a state machine.

8. The circuit of claim 6, wherein the logic element includes a programmable logic device.

9. The circuit of claim 6, wherein the clock element is coupled with each of the one or more analog-to-digital converters and is operable to provide a sampling clock to each converter.

10. The circuit of claim 6, wherein the logic element adjusts the clock signal only between data collection periods to prevent data corruption.

11. The circuit of claim 6, wherein the clock element and the logic element are integral.

12. The circuit of claim 6, wherein the temperature sensor includes a digital temperature sensor.

13. A temperature compensating circuit comprising:
- a plurality of analog-to-digital converters each operable to sample an input signal;
- a clock element coupled with the analog-to-digital converters and operable to provide a sampling clock signal and an adjustable clock signal;
- a plurality of digital filter elements each having a setup time and a hold time, each digital filter element operable to—
  - couple with the clock element and one or more of the analog-to-digital converters,
  - receive the adjustable clock signal,
  - acquire data from one or more of the analog-to-digital converters according to the received clock signal, and
  - modify the data acquired by the analog-to-digital converters;
- a digital temperature sensor operable to sense an ambient temperature; and
- a logic element coupled with the clock element and the digital temperature sensor, the logic element operable to acquire the ambient temperature from the temperature sensor and, between data collection periods, adjust the clock signal based upon the acquired ambient temperature to correspond to the setup and hold times of the digital filter elements.

14. The circuit of claim 13, wherein the logic element includes a state machine.

15. The circuit of claim 13, wherein the logic element includes a programmable logic device.

16. The circuit of claim 13, wherein the adjustable clock signal is operable to be adjusted in increasing and decreasing increments of approximately 300 picoseconds.

17. The circuit of claim 13, wherein the clock element and the logic element are integral.

18. The circuit of claim 13, wherein the analog-to-digital converters, the clock element, the plurality of digital filter elements, the temperature sensor, and logic element are mounted on a common circuit board.

* * * * *